(12) United States Patent
Chen

(10) Patent No.: US 10,607,529 B2
(45) Date of Patent: Mar. 31, 2020

(54) SHIFT REGISTER UNIT AND DRIVING METHOD THEREOF, GATE DRIVING CIRCUIT AND DISPLAY APPARATUS

(71) Applicants: BOE TECHNOLOGY GROUP CO., LTD., Beijing (CN); BEIJING BOE DISPLAY TECHNOLOGY CO., LTD., Beijing (CN)

(72) Inventor: Huabin Chen, Beijing (CN)

(73) Assignees: BOE TECHNOLOGY GROUP CO., LTD., Beijing (CN); BEIJING BOE DISPLAY TECHNOLOGY CO., LTD., Beijing (CN)

( * ) Notice: Subject to any disclaimer, the term of this patent is extended or adjusted under 35 U.S.C. 154(b) by 14 days.

(21) Appl. No.: 15/504,551

(22) PCT Filed: Jun. 14, 2016

(86) PCT No.: PCT/CN2016/085702
§ 371 (c)(1),
(2) Date: Feb. 16, 2017

(87) PCT Pub. No.: WO2017/133155
PCT Pub. Date: Aug. 10, 2017

(65) Prior Publication Data
US 2018/0108290 A1    Apr. 19, 2018

(30) Foreign Application Priority Data
Feb. 1, 2016   (CN) .......................... 2016 1 0068705

(51) Int. Cl.
*G09G 3/20*   (2006.01)
*G11C 19/28*   (2006.01)
(Continued)

(52) U.S. Cl.
CPC ............ *G09G 3/2092* (2013.01); *G11C 7/02* (2013.01); *G11C 19/28* (2013.01); *G11C 19/287* (2013.01);
(Continued)

(58) Field of Classification Search
CPC ... G09G 2310/0286; G09G 2310/0289; G09G 3/3266; G09G 2300/0823; G09G 2320/02;
(Continued)

(56) References Cited

U.S. PATENT DOCUMENTS 5,459,510 A    10/1995 Hamalainen
8,723,844 B2 *  5/2014 Ko ....................... G09G 3/3677
                                              345/204
(Continued)

FOREIGN PATENT DOCUMENTS

CN    102682692 A    9/2012
CN    103489484 A    1/2014
(Continued)

OTHER PUBLICATIONS

International Search Report and Written Opinon dated Oct. 18, 2016; PCT/CN2016/085702.
(Continued)

*Primary Examiner* — Dismery Mercedes
(74) *Attorney, Agent, or Firm* — Ladas & Parry LLP; Hermine Valizadeh

(57) ABSTRACT

A shift register unit and a driving method thereof, a gate driving circuit and a display apparatus are disclosed. The shift register unit includes: a pull-up node control module (21), a pull-down node control module (22), a gate driving signal output terminal (OUTPUT(N)) and a gate driving signal output module (23), the gate driving signal output module (23) is connected to a pull-up node (PU(N)), a pull-down node (PD(N)), an non-inverting clock signal input terminal (CLK) and the gate driving signal output terminal (OUTPUT(N) respectively; and the pull-down node control module (22) is connected to the pull-down node (PD(N)) and an inverting clock signal input terminal
(Continued)

(CLKB) respectively; the shift register unit further includes: a noise reduction module (24) connected to a noise reduction control signal output terminal (Ctrl) and a gate driving signal output terminal respectively (OUTPUT(N)).

11 Claims, 6 Drawing Sheets

(51) Int. Cl.
*G11C 7/02* (2006.01)
*G09G 3/36* (2006.01)
*G09G 3/3266* (2016.01)

(52) U.S. Cl.
CPC ......... *G09G 3/3266* (2013.01); *G09G 3/3674* (2013.01); *G09G 2300/0823* (2013.01); *G09G 2310/0286* (2013.01); *G09G 2310/0289* (2013.01); *G09G 2310/061* (2013.01); *G09G 2310/08* (2013.01); *G09G 2320/02* (2013.01); *G09G 2330/06* (2013.01)

(58) Field of Classification Search
CPC ....... G09G 2320/04; G09G 2310/0283; G09G 2310/061; G09G 3/3677; G09G 3/3674; G09G 2320/0209; G09G 2320/043; G09G 2320/0247; G09G 2330/06; G09G 2300/0819; G09G 3/2092; G09G 3/3696; G09G 2310/08; G09G 3/3648; G09G 3/3258; G09G 2300/0408; G09G 2320/0252; G09G 5/18; G11C 19/28; G11C 19/287; G11C 19/184; G11C 8/04; G11C 7/02; G11C 7/1036
See application file for complete search history.

(56) References Cited

U.S. PATENT DOCUMENTS

| | | | | |
|---|---|---|---|---|
| 8,976,922 B2* | 3/2015 | Shang | ................... | G11C 19/28 377/64 |
| 9,153,342 B2* | 10/2015 | Gu | ....................... | G09G 3/3611 |
| 9,991,004 B2* | 6/2018 | Yang | ...................... | G11C 19/28 |
| 10,210,835 B2* | 2/2019 | Han | ...................... | G09G 3/3677 |
| 2008/0101529 A1* | 5/2008 | Tobita | .................. | G09G 3/3677 377/64 |
| 2008/0285705 A1 | 11/2008 | Wei et al. | | |
| 2010/0110047 A1* | 5/2010 | Yoon | .................... | G09G 3/3677 345/204 |
| 2010/0156474 A1* | 6/2010 | Park | ...................... | G09G 3/3677 327/108 |
| 2011/0148853 A1* | 6/2011 | Ko | ........................ | G09G 3/3677 345/213 |
| 2012/0256817 A1* | 10/2012 | Chen | ...................... | G11C 19/28 345/92 |
| 2013/0077736 A1* | 3/2013 | Son | .......................... | G09G 3/20 377/69 |
| 2013/0088265 A1* | 4/2013 | Chen | ...................... | H03K 5/153 327/108 |
| 2014/0079175 A1 | 3/2014 | Wu | | |
| 2014/0086379 A1* | 3/2014 | Ma | ......................... | G11C 19/28 377/64 |
| 2014/0192039 A1* | 7/2014 | Wang | ..................... | G11C 19/28 345/213 |
| 2014/0240209 A1* | 8/2014 | Zhang | ................... | G09G 3/3648 345/92 |
| 2015/0255031 A1* | 9/2015 | Cao | ........................ | G09G 3/3648 345/210 |
| 2016/0133337 A1* | 5/2016 | Gu | ......................... | G11C 19/28 377/64 |
| 2016/0225336 A1* | 8/2016 | Gu | ......................... | G11C 19/28 |
| 2016/0260402 A1* | 9/2016 | Otose | ................... | G09G 3/3648 |
| 2017/0018243 A1* | 1/2017 | Huang | .................... | G09G 3/36 |

FOREIGN PATENT DOCUMENTS

CN 105513524 A 4/2016
EP 2357643 A1 8/2011

OTHER PUBLICATIONS

The First Chinese Office Action dated Sep. 5, 2017: Appln. No. 201610068705.6.

* cited by examiner

SHIFT REGISTER UNIT AND DRIVING METHOD THEREOF, GATE DRIVING CIRCUIT AND DISPLAY APPARATUS

CROSS-REFERENCE TO RELATED APPLICATION

The present application claims the priority of a Chinese patent application No. 201610068705.6 filed on Feb. 1, 2016. Herein, the content disclosed by the Chinese patent application is incorporated in full by reference as a part of the present disclosure.

TECHNICAL FIELD

The present disclosure relates to a shift register unit and a driving method thereof, a gate driving circuit and a display apparatus.

BACKGROUND

In a shift register unit in related art, a pull down gate driving signal is controlled by a pull-down node in an output off maintenance phase. However, a time for pulling down the gate driving signal in the output off maintenance phase is 50%, while in another time when the gate driving signal is not pulled down, it is possible that the gate driving signal cannot be maintained at a low level due to leakage of electricity of the pull-up transistor. Therefore, reduction of noise cannot be performed well on the gate driving signal.

SUMMARY

There are provided in some embodiments of the present disclosure a shift register unit and a driving method thereof, a gate driving circuit and a display apparatus, to solve a problem in the related art, i.e., a time for pulling down the gate driving signal in the output off maintenance phase is 50%, while in another time when the gate driving signal is not pulled down, it is likely that the gate driving signal cannot be maintained at a low level due to leakage of electricity of the pull-up transistor, such that reduction of noise cannot be performed well on the gate driving signal by the existing gate driving signal output module.

According to one aspect of the present disclosure, there is provided a shift register unit, comprising a pull-up node control module, a pull-down node control module, a gate driving signal output terminal and a gate driving signal output module, wherein the gate driving signal output module is connected to a pull-up node, a pull-down node, a non-inverting clock signal input terminal and the gate driving signal output terminal respectively; and the pull-down node control module is connected to the pull-down node and an inverting clock signal input terminal respectively; the shift register unit further comprising: a noise reduction module connected to a noise reduction control signal output terminal and a gate driving signal output terminal respectively.

Alternatively, the pull-down node control module is configured to control a potential of the pull-down node to be the same as a potential of the inverting clock signal in an output off maintenance phase; in the output off maintenance phase, the noise reduction control signal and the inverting clock signal have phases inverted to each other; the noise reduction module is configured to control the gate driving signal output terminal to be input a low level when the noise reduction control signal is active; the non-inverting clock signal and the inverting clock signal have phases inverted to each other.

Alternatively, when the gate driving circuit comprising multiple stages of shift register units is connected to 2n clock signal input terminals, the noise reduction control signal output terminal is connected to a pull-down node of a (N+n)-th stage of shift register unit, where n is a positive integer, and N is a stage number of a present stage of shift register unit in the gate driving circuit.

Alternatively, when n is greater than 1, the noise reduction control signal output terminal is further connected to a pull-down node of a (N+m)-th stage of shift register unit, where m is a positive integer less than n.

Alternatively, when the gate driving circuit is connected to two clock signal output terminals, the noise reduction control signal output terminal is connected to a pull-down node of an adjacent next stage of shift register unit; the noise reduction module comprises: a noise reduction transistor, whose gate is connected to the pull-down node of the adjacent next stage of shift register unit, first electrode is connected to the gate driving signal output terminal, and second electrode is input a low level; the non-inverting clock signal is provided to the present stage of shift register unit by a first clock signal input terminal, and the inverting clock signal is provided to the present stage of shift register unit by a second cock signal input terminal; the non-inverting clock signal is provided to the adjacent next stage of shift register unit by the second clock signal input terminal, and the inverting clock signal is provided to the adjacent next stage of shift register unit by the first clock signal input terminal.

Alternatively, when the gate driving circuit is connected to four clock signal output terminals, the noise reduction control signal output terminal is connected to a pull-down node of a (N+2)-th stage of shift register unit; the noise reduction module comprises: a first noise reduction transistor, whose gate is connected to the pull-down node of the (N+2)-th stage of shift register unit, first electrode is connected to the gate driving signal output terminal, and second electrode is connected to the low level; the non-inverting clock signal is provided to the present stage of shift register unit by the first clock signal input terminal, and the inverting clock signal is provided to the present stage of shift register unit by a third clock signal input terminal; the non-inverting clock signal is provided to the (N+2)-th stage of shift register unit by the third clock signal input terminal, and the inverting clock signal is provided to the (N+2)-th stage of shift register unit by the first clock signal input terminal; the first clock signal has a phase inverted to that of the third clock signal; the second clock signal is delayed 0.25 clock cycle compared to the first clock signal, the fourth clock signal is delayed 0.25 clock cycle compared to the third clock signal, and a duty ratio of the first clock signal, the second clock signal, the third clock signal, and the fourth clock signal is 0.5.

Alternatively, m is equal to 1; the noise reduction module comprises: a second noise reduction transistor, whose gate is connected to a pull-down node of a (N+1)-th stage of shift register unit, first electrode is connected to the gate driving signal output terminal, and second electrode is connected to the low level; the non-inverting clock signal is provided to the (N+1)-th stage of shift register unit by the second clock signal input terminal, and the inverting clock signal is provided to the (N+1)-th stage of shift register unit by a fourth clock signal input terminal.

There is further provided in another aspect of the present disclosure a driving method of a shift register unit applied to the shift register unit, comprising: controlling a potential of a pull-down node to be the same as a potential of an inverting clock signal in output off maintenance phase; controlling a noise reduction control signal and the inverting clock signal to have phases inverted to each other in the output off maintenance phase; controlling, by a noise reduction module, a gate driving signal output terminal to be input a low level when the noise reduction control signal is active.

There is further provided in another aspect of the present disclosure a gate driving circuit, comprising multiple stages of shift register units.

Alternatively, when the gate driving circuit is connected to 2n clock signal input terminals, a noise reduction control signal output terminal of a N-th stage of shift register unit is connected to a pull-down node of a (N+n)-th stage of shift register unit, where n and N are positive integers.

Alternatively, when n is greater than 1, the noise reduction control signal output terminal of the N-th stage of shift register unit is further connected to a pull-down node of a (N+m)-th stage of shift register unit, where m is a positive integer less than n.

Alternatively, when the gate driving circuit is connected to two clock signal output terminals, the noise reduction control signal output terminal of the N-th stage of shift register unit is connected to a pull-down node of a (N+1)-th stage of shift register unit; a non-inverting clock signal is provided to the N-th stage of shift register unit by a first clock signal input terminal, and an inverting clock signal is provided to the N-th stage of shift register unit by a second cock signal input terminal; the non-inverting clock signal is provided to the (N+1)-th stage of shift register unit by the second clock signal input terminal, and the inverting clock signal is provided to the (N+1)-th stage of shift register unit by the first clock signal input terminal.

Alternatively, when the gate driving circuit is connected to four clock signal output terminals, the noise reduction control signal output terminal of the N-th stage of shift register unit is connected to a pull-down node of a (N+2)-th stage of shift register unit; the non-inverting clock signal is provided to the N-th stage of shift register unit by the first clock signal input terminal, and the inverting clock signal is provided to the N-th stage of shift register unit by a third clock signal input terminal; the non-inverting clock signal is provided to the (N+2)-th of shift register unit by the third clock signal input terminal, and the inverting clock signal is provided to the (N+2)-th stage of shift register unit by the first clock signal input terminal; the first clock signal has a phase inverted to that of the third clock signal; the second clock signal is delayed 0.25 clock cycle compared to the first clock signal, the fourth clock signal is delayed 0.25 clock cycle compared to the third clock signal, and duty ratio of the first clock signal, the second clock signal, the third clock signal, and a fourth clock signal is 0.5.

Alternatively, in is equal to 1; the non-inverting clock signal is provided to the (N+1)-th stage of shift register unit by the second clock signal input terminal, and the inverting clock signal is provided to the (N+1)-th stage of shift register unit by a fourth clock signal input terminal.

There is further provided in another aspect of the present disclosure a display apparatus, comprising the gate driving circuit described above.

Compared with the prior art, the shift register unit and the driving method thereof, the gate driving circuit and the display apparatus as provided in the embodiments of the present disclosure adopt the noise reduction module controlled by the noise reduction control signal together with the gate driving signal output module in the related art to control the noise reduction of the gate driving signal, and also pull down the gate driving signal in a period of time where the non-inverting clock signal is at the high level in the output off maintenance phase, so as to raise the effect of noise reduction.

DETAILED DESCRIPTION

Technical solution in embodiments of the present disclosure will be described clearly and completely by combining with figures in the embodiments of the present disclosure. Obviously; the embodiments described below are just a part of embodiments of the present disclosure instead of all the embodiments. Based on the embodiments of the present disclosure, all the other embodiments obtained by those skilled in the art without paying any inventive work belong to a scope sought for protection in the present disclosure.

Figure 1A:
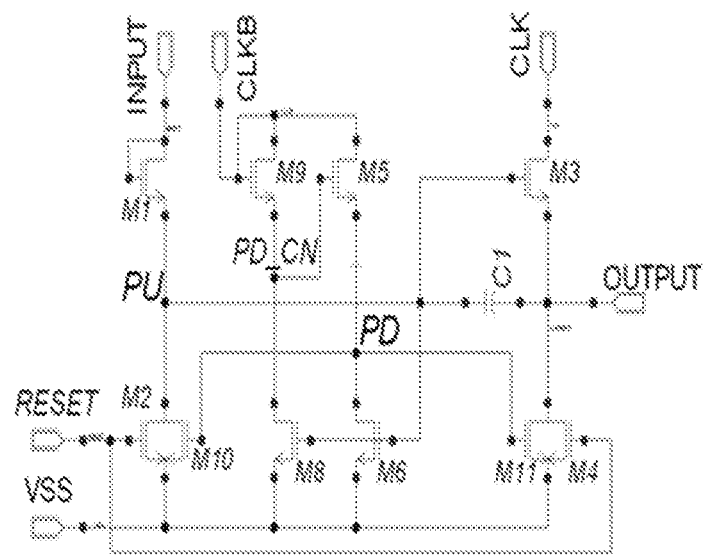
FIG. 1A is a circuit diagram of a known shift register unit.
Figure 1B:
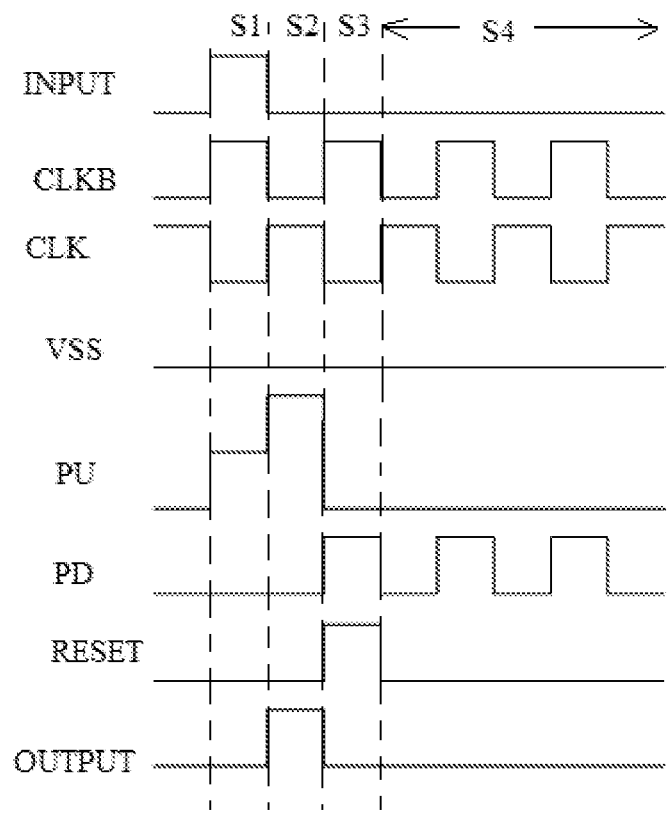
FIG. 1B is an operation timing diagram of the shift register unit as shown in FIG. 1A.

FIG. 1A is a circuit diagram of a known shift register unit. FIG. 1B is an operation timing diagram of the shift register unit as shown in FIG. 1A. In FIG. 1B, S1 represents an input phase, S2 represents an output phase, S3 represents a reset phase, and S4 represents an output off maintenance phase. In FIG. 1A, INPUT represents an input terminal, CLK represents a non-inverting clock signal input terminal, RESET represents a reset terminal, VSS represents a low level, M1 is an input transistor, M2 is a first reset transistor, M3 is a pull-up transistor, M4 is a second reset transistor, M5 is a first pull-down node control transistor, M6 is a second pull-down node control transistor, M8 is a first pull-down control node control transistor, M9 is a second pull-down control node control transistor, M10 is a pull-up node control transistor, C1 is a storage capacitor, PD_CN represents a pull-down control node, and PU represents a pull-down node.

As shown in FIG. 1A, the shift register unit in the related art reduces noise of a gate driving signal output terminal OUTPUT by only a pull-down node PD. However, a waveform of the pull-down node PD in the output off maintenance phase is the same as a waveform of an inverting clock signal input by an inverting clock signal input terminal CLKB, that is, a time when a potential of a gate of a pull-down transistor M11 used for pulling down a gate driving signal is a high level is only 50%. Since a size of a pull-up transistor M3 in FIG. 1A is large, a parasitic capacitance of M3 would be large; as shown in FIG. 1B, in the output off maintenance phase S4, since a parasitic capacitance between CLK and the pull-up node PU is large, when the non-inverting clock signal input terminal CLK is input the high level, in particular in a special environment such as high temperature or the like, a leakage current of M3 would be also large, which causes that M3 is not turned off completely, such that the gate driving signal output by OUTPUT is not at the low level at this time. Thereby, noise of the gate driving signal cannot be reduced well.

In order to remove the above problem, there is provided in an embodiment of the present disclosure a shift register unit.

Figure 2:
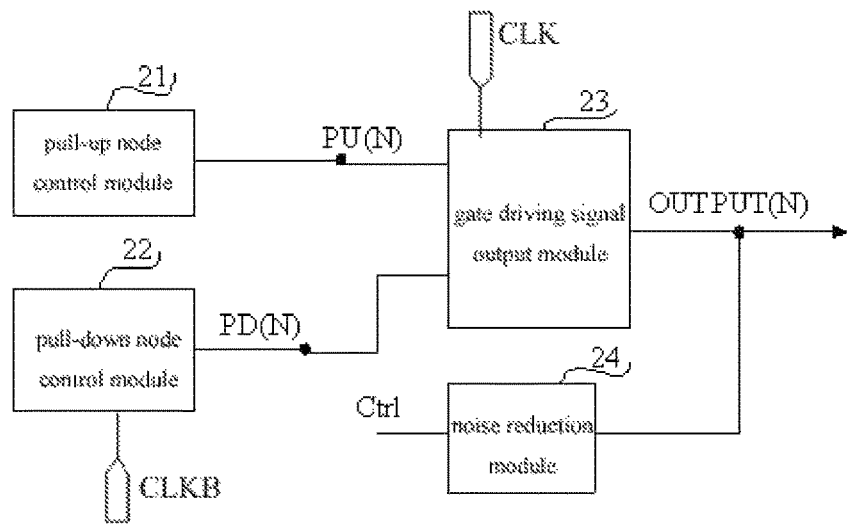
FIG. 2 is a structure diagram of a shift register unit in at least some embodiments of the present disclosure.

As shown in FIG. 2, the shift register unit as described in the embodiment of the present disclosure comprises a pull-up node control module 21, a pull-down node control module 22, a gate driving signal output terminal OUTPUT (N) and a gate driving signal output module 23. Herein, N is a positive integer, and N is a number of stages of the shift register unit as described in the embodiment of the present disclosure in an entire gate driving circuit.

Herein, the gate driving signal output module 23 is connected to a pull-up node PU(N), a pull-down node PD(N), a non-inverting clock signal input terminal CLK and the gate driving signal output terminal OUTPUT(N) respectively.

The pull-down node control module 22 is connected to the pull-down node PD(N) and the inverting clock signal input terminal CLKB respectively.

The shift register unit further comprises: a noise reduction module 24 connected to a noise reduction control signal output terminal Ctrl and the gate driving signal output terminal OUTPUT(N) respectively.

The shift register unit as described in the embodiment of the present disclosure adopts the noise reduction module controlled by the noise reduction control signal together with the gate driving signal output module to control the noise reduction of the gate driving signal, and also pull down the gate driving signal in a period of time where the non-inverting clock signal is the high level in the output off maintenance phase, so as to raise the effect of noise reduction.

In implementation of the shift register unit as shown in FIG. 2, the pull-up node control module 21 is connected to the pull-up node PU(N) and configured to control the potential of the pull-up node PU(N).

Optionally, when the embodiment of the shift register unit as shown in FIG. 2 operates, the pull-down node control module 22 is configured to control a potential of the pull-down node to be the same as a potential of the inverting clock signal in the output off maintenance phase.

In the output off maintenance phase, an inverting clock signal input by the inverting clock signal input terminal CLKB and a noise reduction control signal output by the noise reduction control signal output terminal Ctrl have phases inverted to each other.

The noise reduction module 24 is configured to control the gate driving signal output terminal OUTPUT(N) to be connected to the low level when the noise reduction control signal is active.

The non-inverting clock signal and the inverting clock signal have phases inverted to each other.

In actual operation, a gate of a pull-down transistor comprised in the gate driving signal output module and used to reduce noise of the gate driving signal output terminal is connected to the pull-down node. When the potential of the pull-down node is active, the pull-down transistor is turned on, in general situation, the waveform of the signal input to the pull-down node is the same as the waveform of the inverting clock signal in the output off maintenance phase, that is, the time for pulling down the gate driving signal in the output off maintenance phase is 50%. As a result, noise of the gate driving signal cannot be reduced well by only the gate driving signal output module. The shift register unit as described in the embodiment of the present disclosure enables the time for pulling down the gate driving signal to increase from 50% to 100% by setting the noise reduction control signal and the inverting clock signal to have phases inverted to each other, and discharging the gate driving signal by the noise reduction module controlled by the noise reduction control signal, so as to enhance the effect of noise reduction of the gate driving signal.

According to an optional implementation, when the gate driving circuit comprising multiple stages of shift register units is connected to 2n clock signal input terminals, the noise reduction control signal output terminal is connected to a pull-down node of a (N+n)-th stage of shift register unit, where n is a positive integer, and N is the number of stages of the present stage of shift register unit in the gate driving circuit.

Figure 3A:
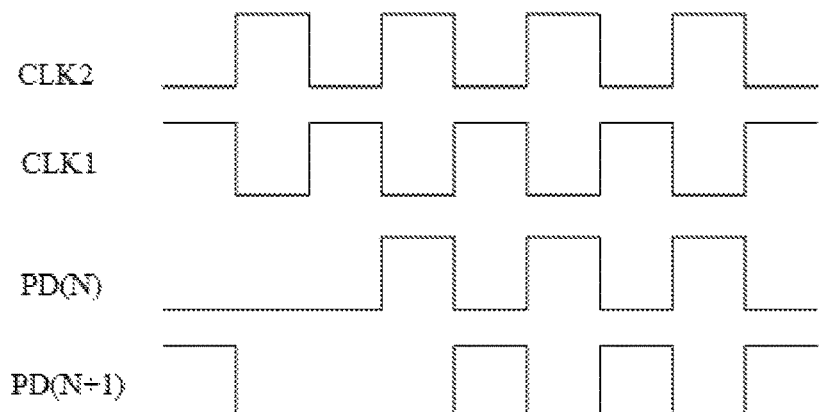
FIG. 3A is an operation timing diagram when the shift register unit as shown in FIG. 2 is input two clock signals.

In an optional implementation, as shown in FIG. 3A, when the gate driving circuit is input a first clock signal CLK1 and a second clock signal CLK2 having phases inverted to each other, the noise reduction control signal output terminal is connected to a pull-down node PD(N+1) of a (N+1)-th stage of shift register unit; that is, when a non-inverting clock signal input terminal of a N-th stage of shift register unit is input the first clock signal CLK1 and an inverting clock signal of the N-th stage of shift register unit is input the second clock signal CLK2, a non-inverting clock signal input terminal of a (N+1)-th stage of shift register unit is input the second clock signal CLK2, and an inverting clock signal of the (N+1)-th stage of shift register unit is input the first clock signal CLK1. In the output off maintenance phase, the signal input to PD(N+1) is the same as CLK1, the signal input to PD(N) is the same as CLK2, and the signal input to PD(N+1) has a phase inverted to that of the signal input to PD(N).

Figure 3B:
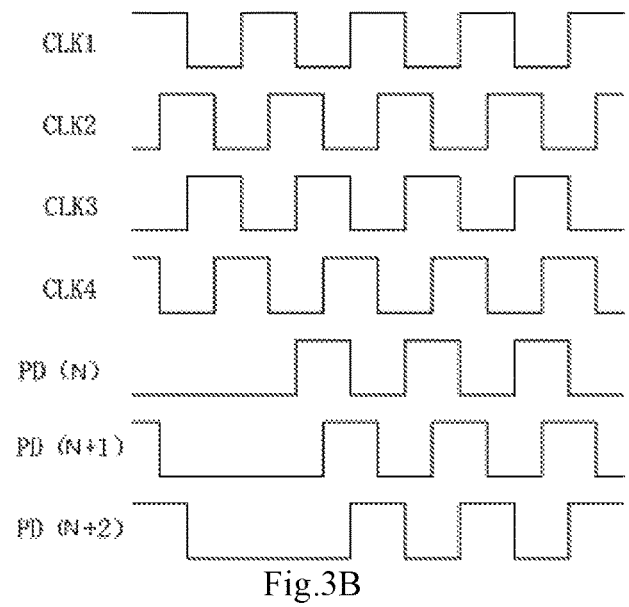
FIG. 3B is an operation timing diagram when the shift register unit as shown in FIG. 2 is input four clock signals.

As shown in FIG. 3B, when the gate driving circuit is input the first clock signal CLK1, the second clock signal CLK2, a third clock signal CLK3, and a fourth clock signal CLK4, the noise reduction control signal output terminal is connected to a pull-down node PD(N+2) of a (N+2)-th stage of shift register unit, CLK1 has a phase inverted to that of CLK3, and CLK2 has a phase inverted to that of CLK4. When the non-inverting clock signal input terminal of the N-th stage of shift register unit is input CLK1 and the inverting clock signal input terminal of the N-th stage of shift register unit is input CLK3, the non-inverting clock signal input terminal of the (N+1)-th stage of shift register unit is input CLK2, the inverting clock signal input terminal of the (N+1)-th stage of shift register unit is input CLK4, a non-inverting clock signal input terminal of the (N+2)-th stage of shift register unit is input CLK3, an inverting clock signal input terminal of the (N+2)-th stage of shift register unit is input CLK1, a non-inverting clock signal input terminal of a (N+3)-th stage of shift register unit is input CLK4, and an inverting clock signal input terminal of the (N+3)-th stage of shift register unit is input CLK2; in the output off maintenance phase, the signal input to PD(N+2) is the same as CLK1, the signal input to PD(N) is the same as CLK3, and the signal input to PD(N+2) has a phase inverted to that of the signal of PD(N). Furthermore, when the gate driving circuit is input the first clock signal, the second clock signal, the third clock signal, the fourth clock signal, the fifth clock signal and the sixth clock signal, the noise reduction control signal output terminal is connected to the pull-down node of the (N+3)-th stage of shift register unit, the first clock signal has a phase inverted to that of the fourth clock signal, the second clock signal has a phase inverted to that of the fifth clock signal, and the third clock signal has a phase inverted to that of the sixth clock signal. When the non-inverting clock signal input terminal of the N-th stage of shift register unit is input the first clock signal and the inverting clock signal input terminal of the N-th stage of shift register unit is input the fourth clock signal, the non-inverting clock signal input terminal of the (N+1)-th stage of shift register unit is input the second clock signal, the inverting clock signal input terminal of the (N+1)-th stage of shift register unit is input a fifth clock signal, the non-inverting clock signal input terminal of the (N+2)-th stage of shift register unit is input the third clock signal, the inverting clock signal input terminal of the (N+2)-th stage of shift register unit is input a sixth clock signal, the non-inverting clock signal input terminal of the (N+3)-th stage of shift register unit is input the fourth clock signal, the inverting clock signal input terminal of the (N+3)-th stage of shift register unit is input the first clock signal, the non-inverting clock signal input terminal of the (N+4)-th stage of shift register unit is input the fifth clock signal, the inverting clock signal input terminal of the (N+4)-th stage of shift register unit is input the second clock signal, the non-inverting clock signal input terminal of the (N+5)-th stage of shift register unit is input the sixth clock signal, and the inverting clock signal input terminal of the (N+5)-th stage of shift register unit is input the third clock signal; the signal input to the pull-down node of the (N+3)-th stage of shift register unit is the same as the first clock signal, the signal input to the pull-down node of the N-th stage of shift register unit is the same as the fourth clock signal, and the signal input to the pull-down node of the (N+3)-th stage of shift register unit has a phase inverted to that of the signal input to the pull-down node of the N-th stage of shift register unit; when n is equal to a positive integer greater than 4, 5 and so on, it is analogy on such a basis.

Optionally, when n is greater than 1, the noise reduction control signal output terminal is further connected to a pull-down node of a (N+m)-th stage of shift register unit, where m is a positive integer less than n. In a optional situation, the noise reduction control signal output terminal can also be connected to a pull-down node of other stages of shift register units, so as to further optimize the effect of noise reduction.

According to a specific implementation, when the gate driving circuit is connected to two clock signal output terminals, the noise reduction control signal output terminal is connected to a pull-down node of an adjacent next stage of shift register unit.

The noise reduction module comprises: a noise reduction transistor, whose gate is connected to the pull-down node of the adjacent next stage of shift register unit, first electrode is connected to the gate driving signal output terminal, and second electrode is input a low level.

A non-inverting clock signal is provided to the present stage of shift register unit by the first clock signal input terminal, and an inverting clock signal is provided to the present stage of shift register unit by the second clock signal input terminal.

The non-inverting clock signal is provided to the adjacent next stage of shift register by the second clock signal input terminal, and the inverting clock signal is provided to the adjacent next stage of shift register unit by the first clock signal. The specific implementation will be described in particular in the subsequent first specific embodiment of the shift register.

According to another specific implementation, when the gate driving circuit is connected to four clock signal output terminals, the noise reduction control signal output terminal is connected to the pull-down node of the (N+2)-th stage of shift register unit.

The noise reduction module comprises: a first noise reduction transistor, whose gate is connected to the pull-down node of the (N+2)-th stage of shift register unit, first electrode is connected to the gate driving signal output terminal, and second electrode is input the low level.

The non-inverting clock signal is provided to the present stage of shift register unit by the first clock signal input terminal, and the inverting clock signal is provided to the present stage of shift register unit by the third clock signal input terminal.

The non-inverting clock signal is provided to the (N+2)-th stage of shift register unit to the third clock signal input terminal, and the inverting clock signal is provided to the (N+2)-th stage of shift register unit by the first clock signal input terminal.

The first clock signal has a phase inverted to that of the third clock signal.

The second clock signal is delayed 0.25 clock cycle compared to the first clock signal, the fourth clock signal is delayed 0.25 clock cycle compared to the third clock signal, and a duty ratio of the first clock signal, the second clock signal, the third clock signal and the fourth clock signal is 0.5. This specific implementation will be described in particular in the subsequent second specific embodiment of the shift register unit.

Optionally, the noise reduction control signal output terminal is further connected to the pull-down node of the (N+1)-th stage of shift register unit.

The noise reduction module comprises: a second noise reduction transistor, whose gate is connected to the pull-down node of the (N+1)-th stage of shift register unit, first electrode is connected to the gate driving signal output terminal, and second electrode is input the low level, so as to further optimize the effect of noise reduction.

The non-inverting clock signal is provided to the (N+1)-th stage of shift register unit by the second clock signal input terminal, and the inverting clock signal is provided to the (N+1)-th stage of shift register unit by the fourth clock signal input terminal.

Figure 4:
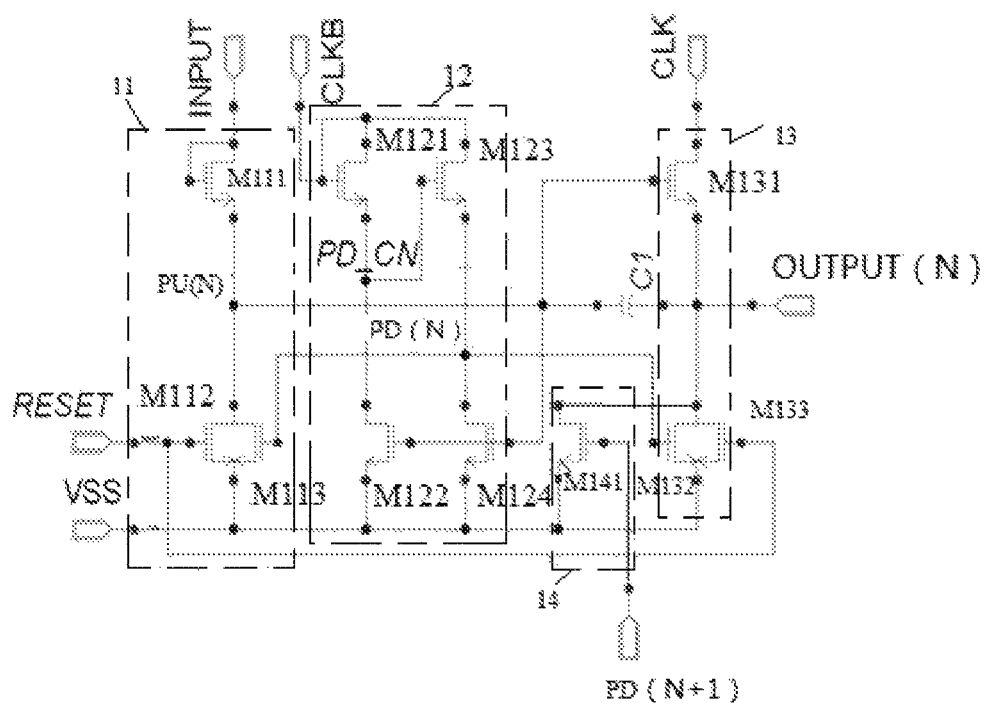
FIG. 4 is a circuit diagram of a shift register unit in at least some embodiments of the present disclosure.

As shown in FIG. 4, the first specific embodiment of the shift register unit as prescribed in the present disclosure comprises a pull-up node control module 11, a pull-down node control module 12, a gate driving signal output terminal OUTPUT(N), a gate driving signal output module 13 and a noise reduction module 14.

The pull-up node control module 11 comprises:

a first pull-up node control transistor M111, whose gate and source are connected to an input terminal INPUT, and drain is connected to a pull-up node PU(N);

a second pull-up node control transistor M112, whose gate is connected to a reset terminal RESET, drain is connected to the pull-up node PU(N), and source is input a low level VSS;

a third pull-up node control transistor M113, whose gate is connected to a pull-down node PD(N), drain is connected to the pull-up node PU(N), and source is input the low level VSS; and a storage capacitor C1, whose first terminal is connected to the pull-up node PU(N), and second terminal is connected to the gate driving signal output terminal OUTPUT(N).

In FIG. 4, M111, M112 and M113 are drawn in a dotted box marked as 11. Due to inconvenience of drawing, the storage capacitor C1 is not drawn in the dotted box marked as 11, but the storage capacitor C1 is also included in the pull-up node control module 11.

The pull-down node control module 12 comprises:

a first pull-down control node control transistor M121, whose gate and drain are connected to the inverting clock signal input terminal CLKB, and source is connected to a pull-down control node PD_CN;

a second pull-down control node control transistor M122, whose gate is connected to the pull-up node PU(N), drain is connected to the pull-down control node PD_CN, and source is input the low level VSS;

a first pull-down node control transistor M123, whose gate is connected to the pull-down control node PD_CN, drain is connected to the inverting clock signal input terminal CLKB, and source is connected to the pull-down node PD(N); and a second pull-down node control transistor M124, whose gate is connected to the pull-up node PU(N), drain is connected to the pull-down node PD(N), and source is input the low level VSS.

The gate driving signal output module 13 comprises:

A first gate driving signal output transistor M131, whose gate is connected to the pull-up node PU(N), drain is connected to the non-inverting clock signal input terminal CLK, and source is connected to the gate driving signal output terminal OUTOUT(N);

a second gate driving signal output transistor M132, whose gate is connected to the pull-down node PD(N), drain is connected to the gate driving signal output terminal OUTPUT(N), and source is input the low level VSS; and a third gate driving signal output transistor M133, whose gate is connected to the reset terminal RESET, drain is connected to the gate driving signal output terminal OUTPUT(N), and source is input the low level VSS.

The noise reduction module 14 comprises:

a first noise reduction transistor M141, whose gate is connected to a pull-down node PD(N+1) of a (N+1)-th stage of shift register unit, drain is connected to the gate driving signal output terminal OUTPUT(N), and source is input the low level VSS.

In the first specific embodiment of the shift register unit as shown in FIG. 4, all the transistors are n-type transistors. However, in actual operation, the above transistors can also adopt p-type transistors. The type of transistors is not limited herein.

Figure 5:
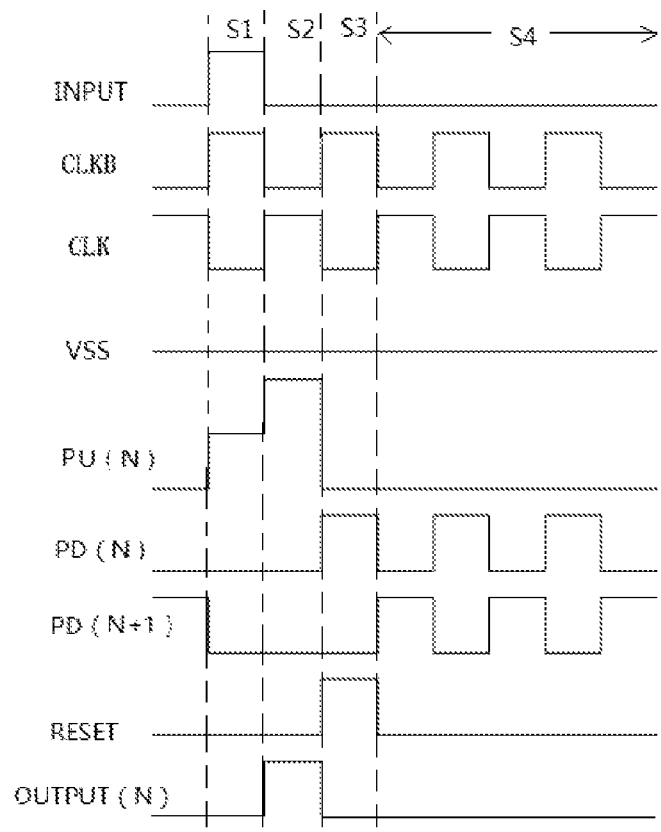
FIG. 5 is an operation timing diagram of the shift register unit as shown in FIG. 4.

As shown in FIG. 5, S1 is an input phase, S2 is an output phase, S3 is a reset phase, and S4 is an output off maintenance phase. It can be known from FIG. 5 that the signal input to PD(N) has a phase inverted to that of the signal input to PD(N+1) in the output off maintenance phase S4.

As shown in FIG. 5, when the first specific embodiment of the shift register unit as described in the present disclosure operates, in input phase S1, an input signal input by INPUT is at a high level, CLKB is input the high level, CLK is input a low level, RESET is input the low level, M111 is turned on, the potential PU(N) is pulled up, and M131 is turned on; However, since CLK is input the low level at this time, OUTPUT(N) outputs the low level; and since the potential of PU(N) is the high level at this time, both M122 and M123 are turned on to pull down the potential of PD(N) and the potential of PD_CN.

In output phase S2, INPUT is input the low level, CLKB is input the low level, CLK is input the high level, RESET is input the low level, the potential of PU(N) is pulled up by C1 bootstrap, the potential of PD(N) and the potential of PD_CN are pulled down continuously, M131 is turned on, and OUTPUT(N) outputs the high level.

In reset phase S3, INPUT is inputted the low level, CLKB is inputted the high level, CLK is inputted the low level, RESET is inputted the high level, and M112 and M133 are turned on to pull down the potential of PU(N) and the gate driving signal output by OUTPUT(N); at this time, M121 is turned on, the potential of PD_CN is the high level to turn on M123, so as to pull up the potential of PD(N). Now, the potential of PD(N+1) is the low level.

In the output off maintenance phase S4, INPUT and RESET are both input the low level, CLKB and CLK output the high level and the low level alternatively, the waveform of the signal input to PD(N) is the same as CLKB, that is, when CLKB is input the high level, the potential of PD(N) is the high level; when CLKB is input the low level, the potential of PD(N) is the low level; in the output off maintenance phase S4, the signal input to PD(N+1) has a phase inverted to that of the signal input to PD(N).

Figure 6:
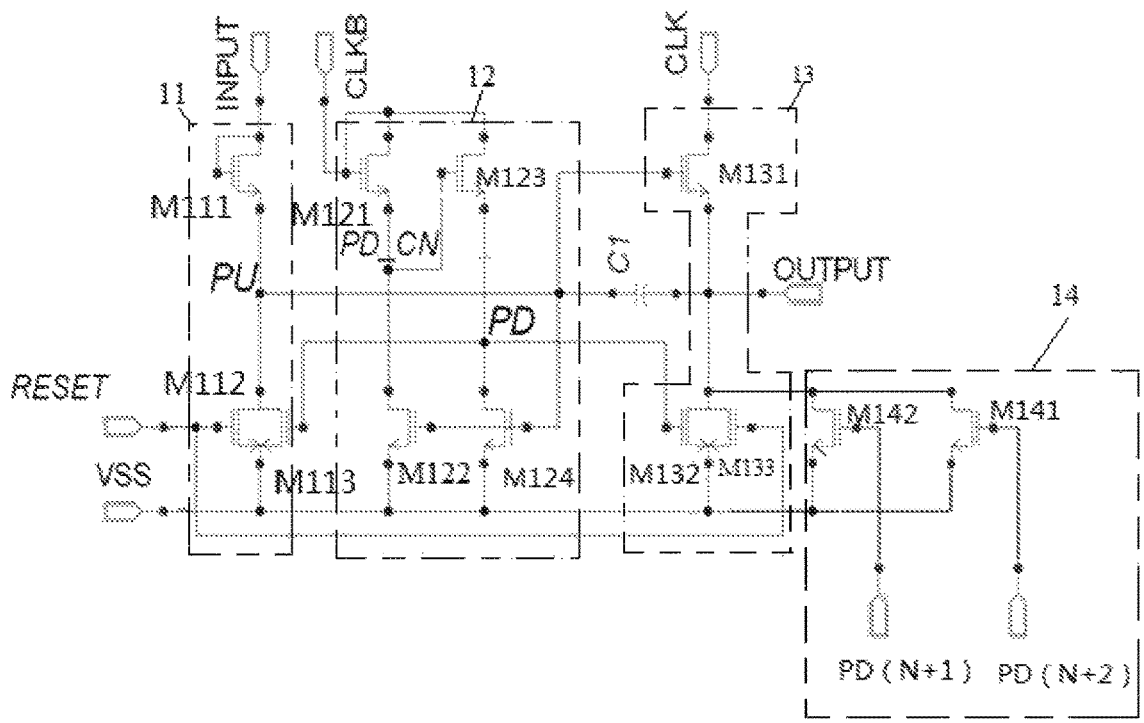
FIG. 6 is a circuit diagram of a shift register unit in at least some embodiments of the present disclosure.

As shown in FIG. 6, the second specific embodiment of the shift register unit as described in the present disclosure comprises a pull-up node control module 11, a pull-down node control module 12, a gate driving signal output terminal OUTPUT(N), a gate driving signal output module 13, and a noise reduction module 14.

The pull-up node control module 11 comprises:

a first pull-up node control transistor M111, whose gate and drain are connected to the input terminal INPUT, and source is connected to the pull-up node PU(N);

a second pull-up node control transistor M112, whose gate is connected to the reset terminal RESET, drain is connected to the pull-up node PU(N), and source is input the low level VSS;

a third pull-up node control transistor M113, whose gate is connected to the pull-down node PD(N), drain is connected to the pull-up node PU(N), and source is input the low level VSS; and a storage capacitor C1, whose first terminal is connected to the pull-up node PU(N), and second terminal is connected to the gate driving signal output terminal OUTPUT(N).

In FIG. 6, M111, M112 and M113 are drawn in the dotted box marked as 11. Due to inconvenience of drawing, the storage capacitor C1 is not drawn in the dotted box marked as 11, but the storage capacitor C1 is also comprised in the pull-up node control module 11.

The pull-down node control module 12 comprises:

a first pull-down control node control transistor M121, whose gate and drain are connected to the inverting clock signal input terminal CLKB, and source is connected to the pull-down control node PD_CN;

a second pull-down control node control transistor M122, whose gate is connected to the pull-up node PU(N), drain is connected to the pull-down control node PD_CN, and source is input the low level VSS;

a first pull-down node control transistor M123, whose gate is connected to the pull-down control node PD_CN, drain is connected to the inverting clock signal input terminal CLKB, and source is connected to the pull-down node PD(N); and the second pull-down node control transistor M124, whose gate is connected to the pull-up node PU(N), drain is connected to the pull-down node PD(N), and source is connected to the low level VSS.

The gate driving signal output module 13 comprises:

a first gate driving signal output transistor M131, whose gate is connected to the pull-up node PU(N), drain is connected to the non-inverting clock signal input terminal CLK, and source is connected to the gate driving signal output terminal OUTPUT(N);

a second gate driving signal output transistor M132, whose gate is connected to the pull-down node PD(N), drain is connected to the gate driving signal output terminal OUTPUT(N), and source is input the low level VSS; and a third gate driving signal output terminal M133, whose gate is connected to the reset terminal RESET, drain is connected to the gate driving signal output terminal OUTPUT(N), and source is input the low level VSS.

The noise reduction module 14 comprises:

a first noise reduction transistor M141, whose gate is connected to the pull-down node PD(N+2) of the (N+2)-th stage of shift register unit, drain is connected to the gate driving signal output terminal OUTPUT(N), and source is input the low level VSS; and a second noise reduction transistor M142, whose gate is connected to the pull-down node PD(N+1) of the (N+1)-th stage of shift register unit, drain is connected to the gate driving signal output terminal OUTPUT(N), and source is input the low level VSS.

In the second specific embodiment of the shift register unit as shown in FIG. 6, all the transistors are n-type transistors. However, in actual operation, the transistors can also be p-type transistors. The type of transistors is not limited herein.

Figure 7:
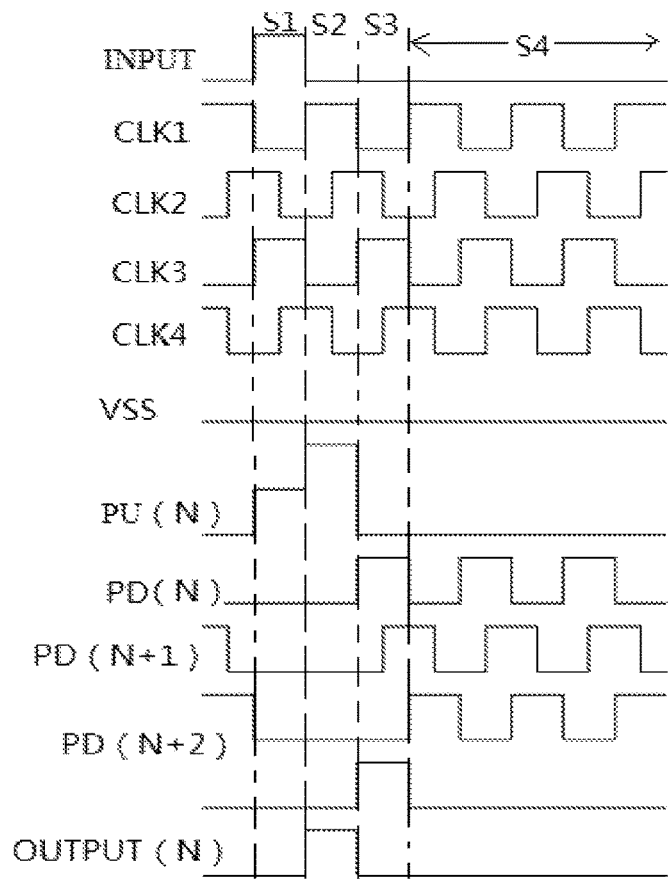
FIG. 7 is an operation timing diagram of the shift register unit as shown in FIG. 6.

As shown in FIG. 7, when the second specific embodiment of the shift register unit as shown in FIG. 6 operates, the non-inverting clock signal input terminal CLK is input the first clock signal CLK1, the inverting clock signal input terminal CLKB is input the third clock signal CLK3; S1 represents an input phase, S2 represents an output phase, S3 represents a reset phase, and S4 represents an output off maintenance phase. Thus it can be known from FIG. 7 that the signal input to PD(N) has a phase inverted to that of the signal input to PD(N+2) in the output off maintenance phase S4.

The first noise reduction transistor M141 controlled by PD(N+2) and the second noise reduction transistors M142 and M132 controlled by PD(N+1) together perform noise reduction on OUTPUT(N).

The second clock signal CLK2 has a phase inverted to that of the fourth clock signal CLK4.

Transistors adopted in all the embodiments of the present disclosure could be thin film transistors or field effect transistors or other devices having same characteristics. In the embodiments of the present disclosure, in order to distinguish two electrodes other than the gate of the transistor, one electrode thereof is called as a source, and the other electrode thereof is called as a drain. In addition, transistors can be divided into n-type transistors or p-type transistors according to the characteristics of the transistors. In the driving circuit provided in the embodiments of the present disclosure, all the transistors are described by taking the n-type transistors as an example. It could be conceived that it is easy for those skilled in the art to think of implementation by using p-type transistors, without paying any creative work. Therefore, it also falls into the protection scope of the embodiments of the present disclosure.

There is further provided in the present disclosure a driving method of a shift register unit applied to the shift register unit, comprising:

controlling a potential of a pull-down node to be the same as a potential of an inverting clock signal in the output off maintenance phase;

controlling a noise reduction control signal and the inverting clock signal to have phases inverted to each other in the output off maintenance phase;

controlling, by a noise reduction module, a gate driving signal output terminal to be connected to a low level when the noise reduction control signal is active.

The driving method of the shift register unit as described in the present disclosure adopts the noise reduction module controlled by the noise reduction control signal together with the gate driving signal output module to control the noise reduction of the gate driving signal, so as to raise the effect of noise reduction.

There is further provided a gate driving circuit, comprising multiple stages of shift register units.

In particular, when the gate driving circuit is connected to 2n clock signal input terminals, a noise reduction control signal output terminal of a N-th stage of shift register unit is connected to a pull-down node of a (N+n)-th stage of shift register unit, where n and N are positive integers.

In particular, when a is greater than 1, the noise reduction control signal output terminal of the N-th stage of shift register unit is further connected to a pull-down node of a (N+m)-th stage of shift register unit, where m is a positive integer less than n.

In particular, when the gate driving circuit is connected to two clock signal output terminals, the noise reduction control signal output terminal of the N-th stage of shift register unit is connected to a pull-down node of a (N+1)-th stage of shift register unit; a non-inverting clock signal is provided to the N-th stage of shift register unit by a first clock signal input terminal, and an inverting clock signal is provided to the N-th stage of shift register unit by a second cock signal input terminal; the non-inverting clock signal is provided to the (N+1)-th stage of shift register unit by the second clock signal input terminal, and the inverting clock signal is provided to the (N+1)-th stage of shift register unit by the first clock signal input terminal.

In particular, when the gate driving circuit is connected to four clock signal output terminals, the noise reduction control signal output terminal of the N-th stage of shift register unit is connected to a pull-down node of a (N+2)-th stage of shift register unit; the non-inverting clock signal is provided to the N-th stage of shift register unit by the first clock signal input terminal, and the inverting clock signal is provided to the N-th stage of shift register unit by a third clock signal input terminal; the non-inverting clock signal is provided to the (N+2)-th stage of shift register unit by the third clock signal input terminal, and the inverting clock signal is provided to the (N+2)-th stage of shift register unit by the first clock signal input terminal; the first clock signal has a phase inverted to that of the third clock signal.

The second clock signal is delayed 0.25 clock cycle compared to the first clock signal, the fourth clock signal is delayed 0.25 clock cycle compared to the third clock signal, and a duty ratio of the first clock signal, the second clock signal, the third clock signal, and the fourth clock signal is 0.5.

In particular, the noise reduction control signal output terminal of the N-th stage shift register unit is further connected to the pull-down node of the (N+1)-th stage of shift register unit; the non-inverting clock signal is provided to the (N+1)-th stage of shift register unit by the second clock signal input terminal, and the inverting clock signal is provided to the (N+1)-th stage of shift register unit by the fourth clock signal input terminal.

The gate driving circuit as described in the present disclosure will be described through two specific embodiments.

Figure 8:
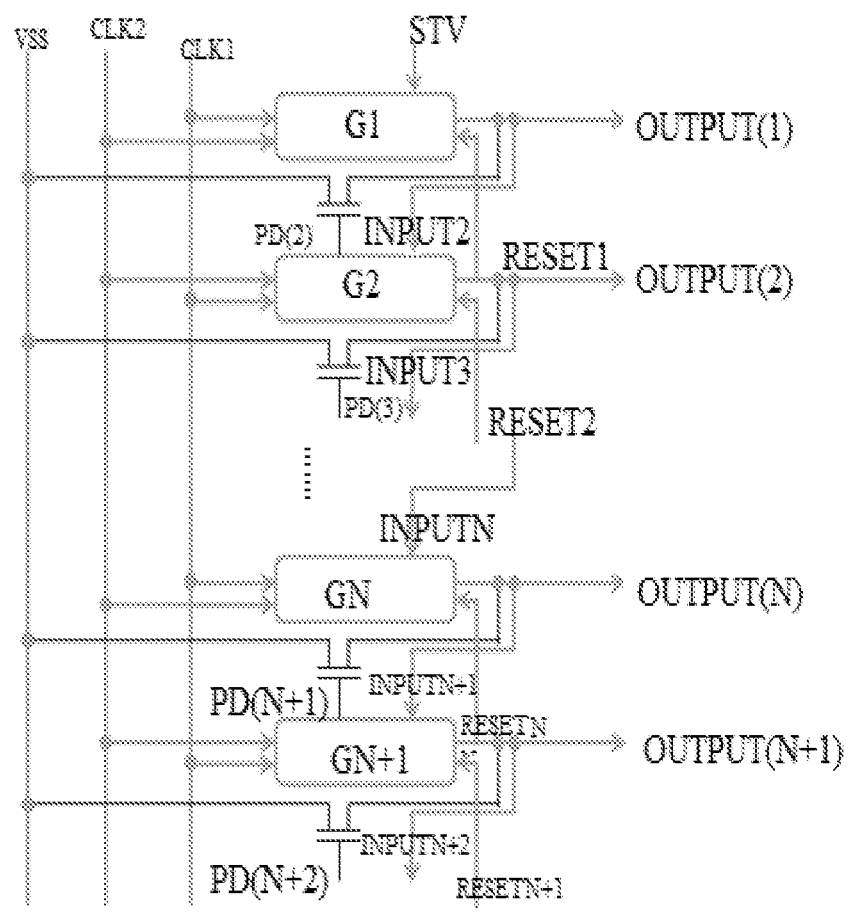
FIG. 8 is a structure diagram of a gate driving circuit in at least some embodiments of the present disclosure.

As shown in FIG. 8, the first specific embodiment of the gate driving circuit as described in the present disclosure comprises multiple stages of shift register units. In FIG. 8, G1 represents a first stage of shift register unit, G2 represents a second stage of shift register unit, GN represents a N-th stage of shift register unit, and GN+1 represents a (N+1)-th stage of shift register unit; N is a positive integer greater than 2.

The gate driving circuit is input the first clock signal CLK1 and the second clock signal CLK2 having phases inverted to each other; a non-inverting clock signal input terminal of G1 is input CLK1, and an inverting clock signal input terminal of G1 is input CLK2; an non-inverting clock signal input terminal of G2 is input CLK2, and an inverting clock signal input terminal of G2 is input CLK1; a non-inverting clock signal input terminal of GN is input CLK1, and an inverting clock signal input terminal of GN is input CLK2; a non-inverting clock signal input terminal of GN+1 is input CLK2, and an inverting clock signal input terminal of GN+1 is input CLK1; an input terminal of G1 is input a start signal STV.

The noise reduction control signal output terminal of each stage of shift register unit is connected to a pull-down node of an adjacent next stage of shift register unit. For example, a noise reduction control signal output terminal of G1 is connected to a pull-down node PD(2) of G2; a noise reduction control signal output terminal of G2 is connected to a pull-down node PD(3) of G3 (G3 is not shown in FIG. 8); a noise reduction control signal output terminal of GN is connected to a pull-down node PD(N+1) of GN+1; a noise reduction control signal output terminal of GN+1 is connected to a pull-down node PD(N+2) of GN+2 (GN+2 is not shown in FIG. 8).

Furthermore, except for a last stage of shift register unit, a reset terminal of each stage of shift register unit is connected to a gate driving signal output terminal of an adjacent next stage of shift register unit; except for a first stage of shift register unit, an input terminal of each stage of shift register unit is connected to a gate driving signal output terminal of an adjacent previous stage of shift register unit.

In FIG. 8, OUTPUT(1) represents a gate driving signal output terminal of a first stage of shift register unit, OUTPUT(2) represents a gate driving signal output terminal of a second stage of shift register unit, OUTPUT(N) represents a gate driving signal output terminal of a N-th stage of shift register unit, and OUTPUT(N+1) represents a gate driving signal output terminal of a (N+1)-th stage of shift register unit; INPUT2 represents an input terminal of (G2, INPUT3 presents G3 (G3 is not shown in FIG. 8), INPUTN represents an input terminal of GN, INPUTN+1 represents an input terminal of GN+1, and INPUTN+2 represents an input terminal of GN+2; RESET1 represents a reset terminal of G1, RESET2 represents a reset terminal of G2, RESETN represents a reset terminal of GN, and RESENTN+1 represents a reset terminal of GN+1.

In particular, the shift register unit comprised in the first specific embodiment of the gate driving circuit as described in the present disclosure can adopt the first specific embodiment of the shift register unit as described in the present disclosure, and can also adopt other forms of shift register units, to which no limitation is given.

Each stage of shift register unit comprised in the first specific embodiment of the gate driving circuit as described in the present disclosure not only discharges the gate driving signal under the control of the pull-down node of the present stage of shift register unit, but also discharges the gate driving signal under the control of the pull-down node of the adjacent next stage of shift register unit, and the signal input to the pull-down node of each stage of shift register unit has a phase inverted to that of the signal input to the pull-down node of the adjacent next stage of shift register unit in the output off maintenance phase, such that the time for pulling down the gate driving signal in the output off maintenance phase increases from 50% to 100%, so as to optimize the effect of noise reduction of the gate driving signal.

Figure 9:
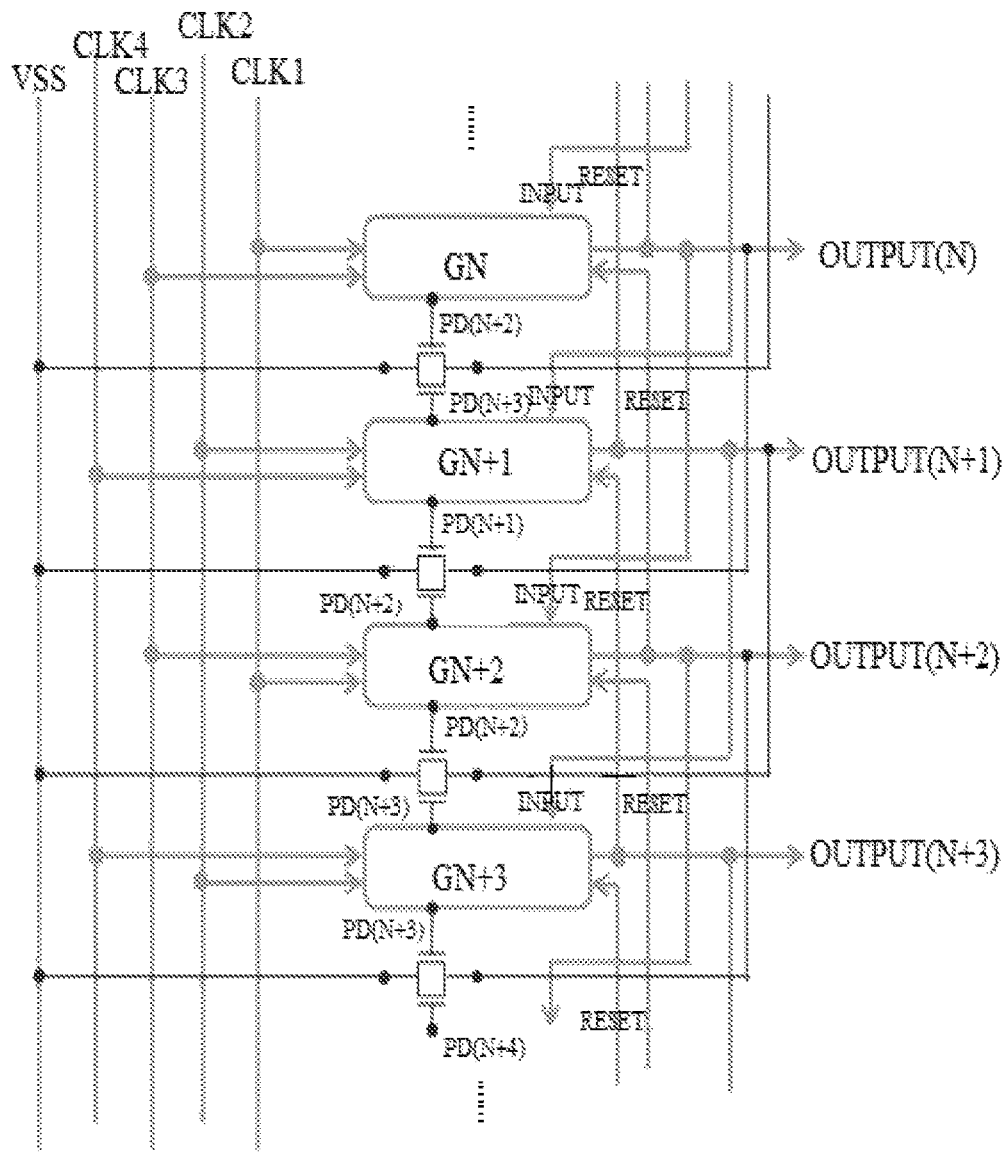
FIG. 9 is a structure diagram of a gate driving circuit in at least some embodiments of the present disclosure.

As shown in FIG. 9, the second specific embodiment of the gate driving circuit as described in the present disclosure comprises multiple stages of shift register units. In FIG. 9, GN represents a N-th stage of shift register unit, GN+1 represents a (N+1)-th stage of shift register unit, GN+2 represents a (N+2)-th stage of shift register unit, and GN+3 represents a (N+3)-th stage of shift register unit; N is a positive integer; INPUT represents an in put terminal, and RESET represents a reset terminal.

The gate driving circuit is input the first clock signal CLK1 and the second clock signal CLK3 having phases inverted to each other, and the gate driving circuit is further input the second clock signal CLK2 and the fourth clock signal CLK4 having phases inverted to each other.

Figure 10:
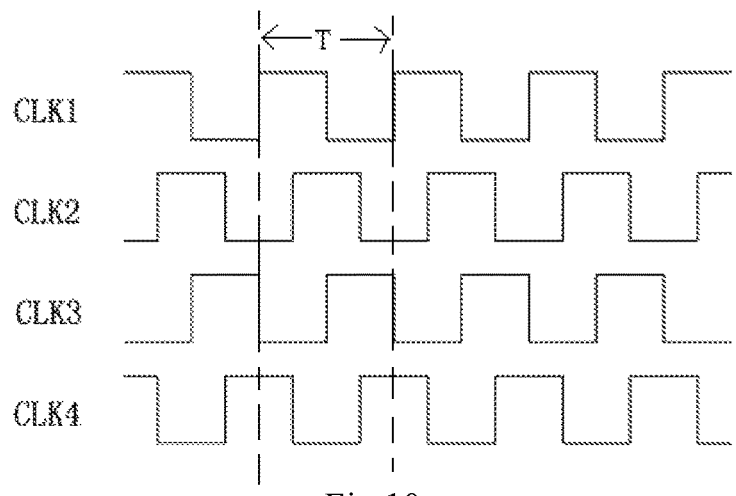
FIG. 10 is a timing diagram when the gate driving circuit as shown in FIG. 9 is input four clock signals.

As shown in FIG. 10, the second clock signal CLK2 is delayed 0.25 clock cycle T compared to the first clock signal CLK1, the fourth clock signal CLK4 is delayed 0.25 clock cycle T compared to the third clock signal CLK3, and a duty ratio of the first clock signal CLK1, the second clock signal CLK2, the third clock signal CLK3 and the fourth clock signal CLK4 is 0.5.

A non-inverting clock signal input terminal of GN is input CLK1, an inverting clock signal input terminal of GN is input CLK3; a non-inverting clock signal input terminal of GN+1 is input CLK2, and an inverting clock signal input terminal of GN+1 is input CLK4; a non-inverting clock signal input terminal of GN+2 is input CLK3, and an inverting clock signal input terminal of GN+2 is input CLK1; a non-inverting clock signal terminal of GN+3 is input CLK4, and an inverting clock signal input terminal of GN+1 is input CLK2.

The noise reduction control signal output terminal of each stage of shift register unit is connected to a pull-down node of an adjacent next stage of shift register unit and a pull-down node of adjacent next two stages of shift register units. For example, a first noise reduction control signal output terminal of GN is connected to a pull-down node PD(N+1) of GN+1, a second noise reduction control signal output terminal of GN is connected to a pull-down node PD(N+2) of GN+2; a first noise reduction control signal output terminal of (GN+1 is connected to the pull-down node PD(N+2) of GN+2, and a second noise reduction control signal output terminal of GN+1 is connected to a pull-down node PD(N+3) of GN+3; a first noise reduction control signal output terminal of GN+2 is connected to the pull-down node PD(N+3) of GN+3, and a second noise reduction control signal output terminal of GN+2 is connected to a pull-down node PD(N+4) of (GN+4 (GN+4 is not shown in FIG. 9).

In FIG. 9, OUTPUT(N) represents a gate driving signal output terminal of a N-th stage of shift register unit, OUTPUT(N+1) represents a gate driving signal output terminal of a (N+1) stage of shift register unit, OUTPUT(N+2) represents a gate driving signal output terminal of a (N+2)-th stage of shift register unit, and OUTPUT(N+3) represents a gate driving signal output terminal of a (N+3)-th stage of shift register unit.

In particular, the shift register unit comprised in the second specific embodiment of the gate driving circuit as described in the present disclosure can adopt the second specific embodiment of the shift register unit as described in the present disclosure, and can also adopt other forms of shift register units, to which no limitation is given.

Each stage of shift register unit comprised in the second specific embodiment of the gate driving circuit as described in the present disclosure not only discharges the gate driving signal under the control of the pull-down node of the present stage of shift register unit, but also discharges the gate driving signal under the control of the pull-down node of the adjacent next stage of shift register unit and the pull-dowry node of the adjacent next two stages of shift register units, and the signal input to the pull-down node of each stage of shift register unit has a phase inverted to that of the signal input to the pull-down node of the adjacent next two stage of shift register units in the output off maintenance phase, such that the time for pulling down the gate driving signal in the output off maintenance phase increases from 50% to 100%, so as to optimize the effect of noise reduction of the gate driving signal. Further, the second specific embodiment of the gate driving circuit as described in the present disclosure discharges gate driving signal of the present stage under the control of the pull-down node of the adjacent next stage of shift register unit, so as to enhance the effect of noise reduction of the gate driving signal.

There is further provided in the present disclosure a display apparatus, comprising the gate driving circuit.

The above descriptions are just alternatively exemplary embodiments of the present disclosure. It shall be pointed out that various improvements and modifications can be made without departing from the principle of the present disclosure for those skilled in the art and these improvements and modifications shall be deemed as falling into the protection scope of the present disclosure.

What is claimed is:

1. A shift register unit, comprising a pull-up node control module, a pull-down node control module, a gate driving signal output terminal and a gate driving signal output module, wherein the gate driving signal output module is connected to a pull-up node, a pull-down node, a non-inverting clock signal input terminal and the gate driving signal output terminal respectively; and the pull-down node control module is connected to the pull-down node and an inverting clock signal input terminal respectively;

wherein the shift register unit is a N-th stage in multiple stages of shift register units comprised in a gate driving circuit, the gate driving circuit is connected to four clock signal output terminals, the second clock signal is delayed 0.25 clock cycle compared to the first clock signal, a fourth clock signal is delayed 0.25 clock cycle compared to the third clock signal, and a duty ratio of the first clock signal, the second clock signal, the third clock signal, and the fourth clock signal is 0.5, and the first clock signal has a phase inverted to that of the third clock signal; and the non-inverting clock signal is provided to the present stage of shift register unit by the first clock signal input terminal, and the inverting clock signal is provided to the present stage of shift register unit by a third clock signal input terminal;

wherein the shift register unit further comprising: a noise reduction module connected to a noise reduction control signal output terminal and the gate driving signal output terminal respectively, the noise reduction control signal output terminal is connected to a pull-down node of a (N+2)-th stage of shift register unit;

the noise reduction module is configured to control the gate driving signal output terminal to be input a low level when the noise reduction control signal is active, in an output off maintenance phase, the noise reduction control signal and the inverting clock signal have phases inverted to each other, wherein the noise reduction module further comprises: a first noise reduction transistor, whose gate is connected to the pull-down node of the (N+2)-th stage of shift register unit, first electrode is connected to the gate driving signal output terminal, and second electrode is input the low level, wherein the non-inverting clock signal is provided to the (N+2)-th stage of shift register unit by the third clock signal input terminal, and the inverting clock signal is provided to the (N+2)-th stage of shift register unit by the first clock signal input terminal.

2. The shift register unit according to claim 1, wherein the pull-down node control module is configured to control a potential of the pull-down node to be the same as a potential of the inverting clock signal in the output off maintenance phase;

the non-inverting clock signal and the inverting clock signal have phases inverted to each other.

3. The shift register unit according to claim 1, wherein the noise reduction control signal output terminal is further connected to a pull-down node of a (N+m)-th stage of shift register unit, where m is a positive integer less than 2.

4. The shift register unit according to claim 3, wherein m is equal to 1;

the noise reduction module comprises: a second noise reduction transistor, whose gate is connected to a pull-down node of a (N+1)-th stage of shift register unit, first electrode is connected to the gate driving signal output terminal, and second electrode is input the low level;

the non-inverting clock signal is provided to the (N+1)-th stage of shift register unit by the second clock signal input terminal, and the inverting clock signal is provided to the (N+1)-th stage of shift register unit by a fourth clock signal input terminal.

5. A driving method of a shift register unit of claim 1, the driving method comprising:

controlling a potential of a pull-down node to be the same as a potential of an inverting clock signal in an output off maintenance phase;

controlling a noise reduction control signal and the inverting clock signal to have phases inverted to each other in the output off maintenance phase;

controlling, by the noise reduction module, the gate driving signal output terminal to be input a low level when the noise reduction control signal is active.

6. A gate driving circuit, comprising multiple stages of shift register units according to claim 1.

7. The gate driving circuit according to claim 6, wherein the noise reduction control signal output terminal of the N-th stage of shift register unit is further connected to a pull-down node of a (N+m)-th stage of shift register unit, where m is a positive integer less than 2.

8. The gate driving circuit according to claim 7, wherein m is equal to 1;
the non-inverting clock signal is provided to the (N+1)-th stage of shift register unit by the second clock signal input terminal, and the inverting clock signal is provided to the (N+1)-th stage of shift register unit by a fourth clock signal input terminal.

9. A display apparatus, comprising the gate driving circuit according to claim 6.

10. The display apparatus according to claim 9, wherein the noise reduction control signal output terminal of the N-th stage of shift register unit is further connected to a pull-down node of a (N+m)-th stage of shift register unit, where m is a positive integer less than 2.

11. The display apparatus according to claim 10, wherein m is equal to 1;
the non-inverting clock signal is provided to the (N+1)-th stage of shift register unit by the second clock signal input terminal, and the inverting clock signal is provided to the (N+1)-th stage of shift register unit by a fourth clock signal input terminal.

* * * * *